United States Patent [19]

Akram et al.

[11] Patent Number: 5,419,807

[45] Date of Patent: May 30, 1995

[54] METHOD OF PROVIDING ELECTRICAL INTERCONNECT BETWEEN TWO LAYERS WITHIN A SILICON SUBSTRATE, SEMICONDUCTOR APPARATUS, AND METHOD OF FORMING APPARATUS FOR TESTING SEMICONDUCTOR CIRCUITRY FOR OPERABILITY

[75] Inventors: Salman Akram, Boise; Warren M. Farnworth, Nampa, both of Id.

[73] Assignee: Micron Technology, Inc., Boise, Id.

[21] Appl. No.: 223,642

[22] Filed: Apr. 6, 1994

Related U.S. Application Data

[63] Continuation-in-part of Ser. No. 207,038, Mar. 7, 1994, which is a continuation-in-part of Ser. No. 116,394, Sep. 3, 1993, Pat. No. 5,326,428.

[51] Int. Cl.$^6$ ............................................. H01L 21/306
[52] U.S. Cl. .................... 156/647.1; 324/500; 324/724; 437/8; 437/228; 437/244; 437/38
[58] Field of Search ................ 156/626, 633, 643, 647, 156/649, 654, 656, 657, 659.1, 662; 437/8, 170, 187, 189, 194, 228, 239, 244; 324/158 R, 158 D, 158 P, 500, 537, 715, 724

[56] References Cited

U.S. PATENT DOCUMENTS

| | | | |
|---|---|---|---|
| 4,312,117 | 1/1982 | Robillard et al. | 29/589 |
| 4,585,991 | 4/1986 | Reid et al. | 324/158 |
| 4,952,272 | 8/1990 | Okino et al. | 156/630 |
| 5,236,428 | 7/1994 | Farnworth et al. | 156/654 |

OTHER PUBLICATIONS

Sarro, P. M. et al.; *Silicon Cantilever Beams Fabricated by Electrochemically Controlled Etching for Sensor Application;* J. Electrochem. Soc.:Solid State Science and Tech, pp. 1724–1729. (Aug. 1986).

*Primary Examiner*—William Powell
*Attorney, Agent, or Firm*—Wells, St. John, Roberts, Gregory & Matkin

[57] ABSTRACT

A method is disclosed of forming a high elevation area and a low elevation area in a substrate and of electrically interconnecting the high elevation area and the low elevation area. The method includes anisotropically etching into a non-masked portion of monocrystalline silicon in a selective manner of one silicon plane relative to another silicon plane to produce a high elevation area and a low elevation area which are laterally angled relative to one another. The high elevation area and the low elevation area thereby interconnected by a substantially planar, non-perpendicularly angled surface. Such areas and plane are then doped to form a continuous electrically conductive and interconnecting diffusion region extending from the high elevation area, through and along the angled surface to the low elevation area. A semiconductor apparatus having the above construction is also disclosed. Also disclosed is an epitaxial silicon growth and etching process, and a semiconductor apparatus having multiple different monocrystalline silicon portions. Further disclosed is a method of producing a testing apparatus having a projection formed essentially of electrically conductive polysilicon.

35 Claims, 3 Drawing Sheets

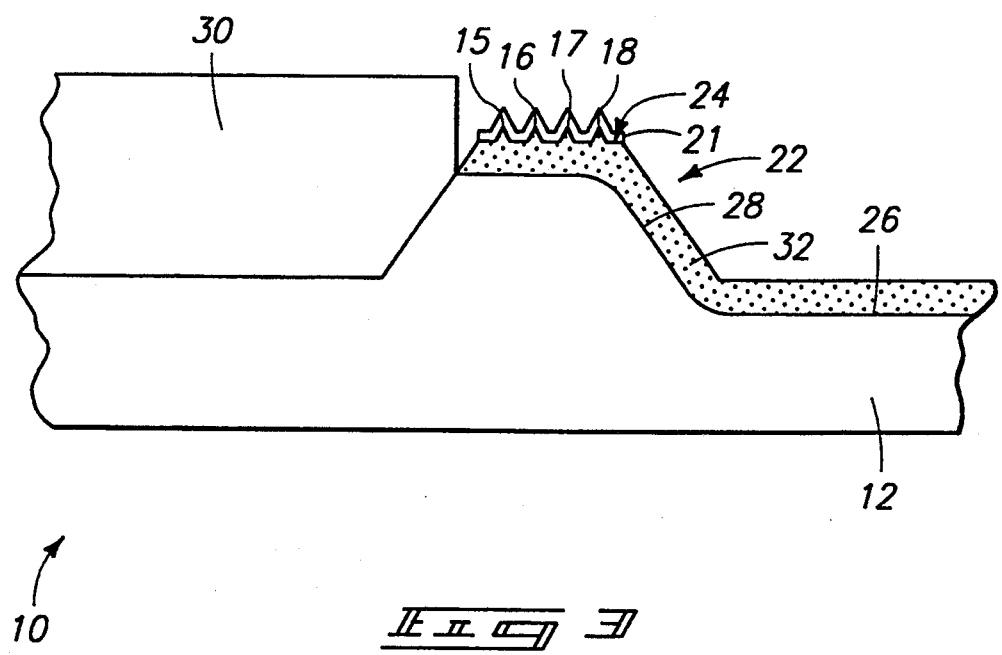
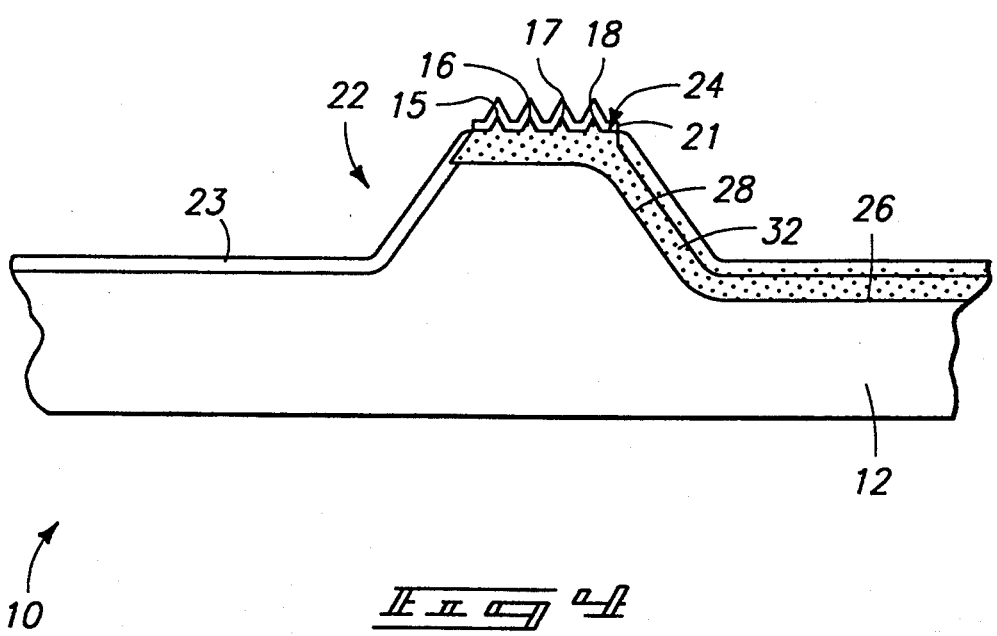

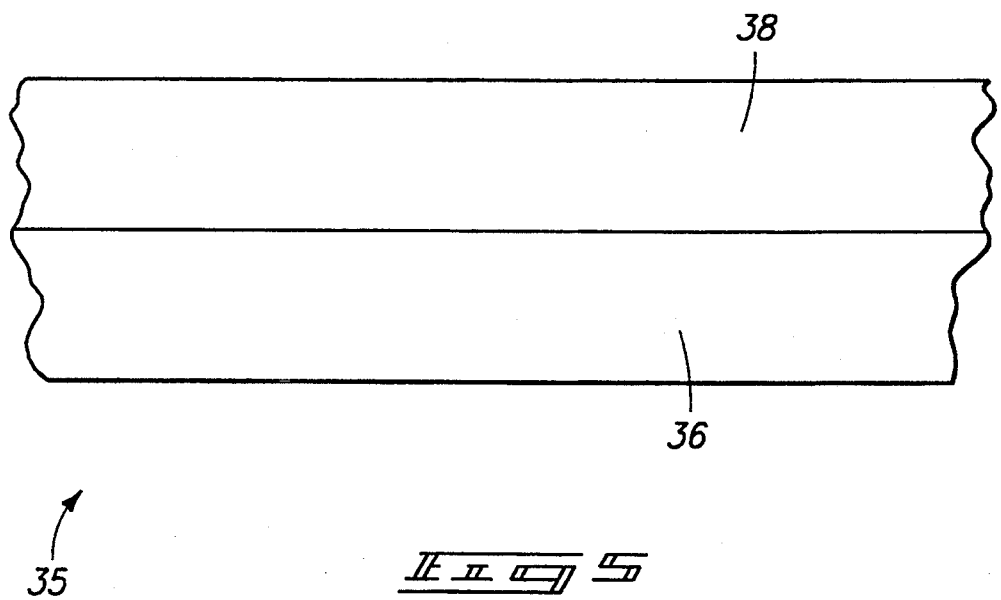
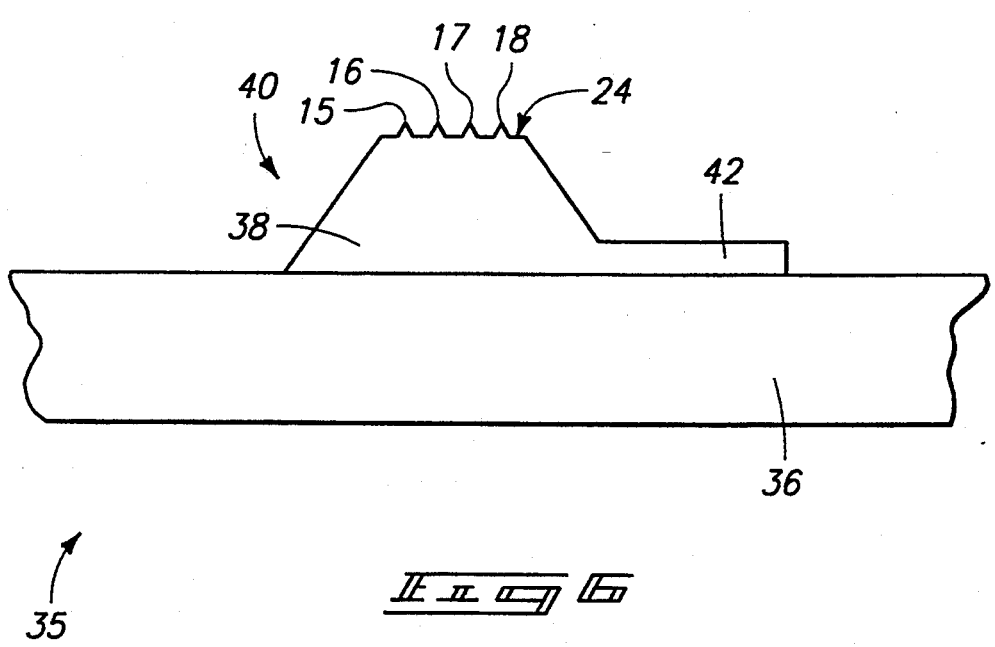

METHOD OF PROVIDING ELECTRICAL INTERCONNECT BETWEEN TWO LAYERS WITHIN A SILICON SUBSTRATE, SEMICONDUCTOR APPARATUS, AND METHOD OF FORMING APPARATUS FOR TESTING SEMICONDUCTOR CIRCUITRY FOR OPERABILITY

RELATED PATENT DATA

This patent resulted from a continuation-in-part application of U.S. patent application Ser. No. 08/207,038, filed Mar. 7, 1994, entitled "Electrically Conductive Projections and Semiconductor Processing Method of Forming Same", by Salman Akram. The continuation-in-part application from which this patent matured also has continuation-in-part priority to the application of U.S. Pat. No. 5,326,428 entitled "Method and Apparatus for Testing Semiconductor Circuitry for Operability and Method of Forming Apparatus for Testing Semiconductor Circuitry for Operability", which resulted from U.S. patent application Ser. No. 08/116,394 to Farnworth et al., filed Sep. 3, 1993. Each of these prior disclosures is hereby fully incorporated into this document by reference.

TECHNICAL FIELD

This invention relates to methods of providing electrical interconnect between two layers within a silicon substrate, to semiconductor apparatus and to a method of forming apparatus for testing semiconductor circuitry for operability.

BACKGROUND OF THE INVENTION

Aspects of the related disclosure grew out of the needs and problems associated with multichip modules. Considerable advancement has occurred in the last fifty years in electronic development and packaging. Integrated circuit density has and continues to increase at a significant rate. However by the 1980's, the increase in density in integrated circuitry was not being matched with a corresponding increase in density of the interconnecting circuitry external of circuitry formed within a chip. Many new packaging technologies have emerged, including that of "multichip module" technology.

In many cases, multichip modules can be fabricated faster and more cheaply than by designing new substrate integrated circuitry. Multichip module technology is advantageous because of the density increase. With increased density comes equivalent improvements in signal propagation speed and overall device weight unmatched by other means. Current multichip module construction typically consists of a printed circuit board substrate to which a series of integrated circuit components are directly adhered.

Many semiconductor chip fabrication methods package individual dies in a protecting, encapsulating material. Electrical connections are made by wire bond or tape to external pin leads adapted for plugging into sockets on a circuit board. However, with multichip module constructions, non-encapsulated chips or dies are secured to a substrate, typically using adhesive, and have outwardly exposed bonding pads. Wire or other bonding is then made between the bonding pads on the unpackaged chips and electrical leads on the substrate.

Much of the integrity/reliability testing of multichip module dies is not conducted until the chip is substantially complete in its construction. Considerable reliability testing must be conducted prior to shipment. In one aspect, existing technology provides temporary wire bonds to the wire pads on the die for performing the various required tests. However this is a low-volume operation, and further requires the test bond wire to ultimately be removed. This can lead to irreparable damage, thus effectively destroying the chip.

Another prior art test technique uses a series of pointed probes which are aligned to physically engage the various bonding pads on a chip. One probe is provided for engaging each bonding pad for providing a desired electrical connection. One drawback with such testing is that the pins undesirably on occasion penetrate completely through the bonding pads, or scratch the bonding pads possibly leading to chip ruin.

The invention described below was motivated in the desire to develop improved electrical interconnection techniques associated with the inventions of the related Ser. Nos. '394 and '038 applications. It is, however, recognized that the invention disclosed herein is further applicable to methods and constructions beyond that disclosed in the related Ser. Nos. '394 and '038 disclosures. This invention, therefore, is limited only by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

FIG. 3 is a view of the FIG. 1 substrate fragment at a processing step subsequent to that shown by FIG. 2.

FIG. 4 is a view of the FIG. 1 substrate fragment at a processing step subsequent to that shown by FIG. 3.

FIG. 5 is a diagrammatical representation of an alternate fragment of a substrate processed in accordance with the invention.

FIG. 6 is a view of the FIG. 5 substrate fragment at a processing step subsequent to that shown by FIG. 5.

DETAILED DESCRIPTION OF THE PREFERRED EMBODIMENTS

Figure 1:
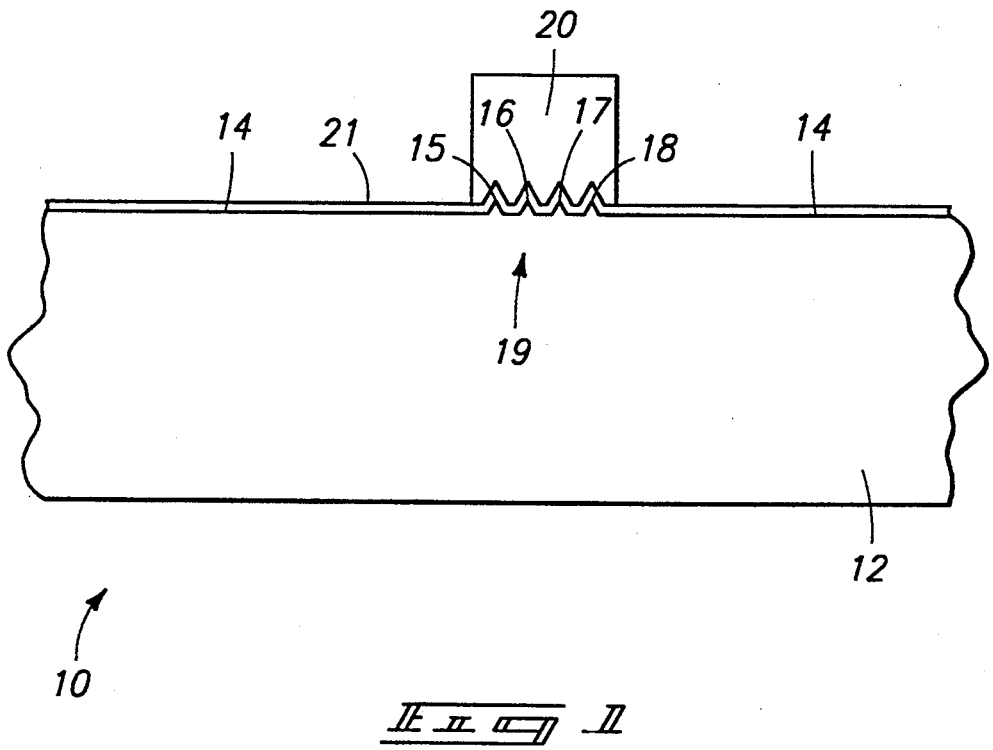
FIG. 1 is a diagrammatic representation of a fragment of a substrate processed in accordance with an aspect of the invention.

This disclosure of the invention is submitted in furtherance of the constitutional purposes of the U.S. Patent Laws "to promote the progress of science and useful arts" (Article 1, Section 8).

The invention includes several aspects. In accordance with a first aspect, a method of forming a high elevation area and a low elevation area in a substrate and of electrically interconnecting the high elevation areas and the low elevation areas comprises the following steps:

providing a substrate having a region of monocrystalline silicon of a given planar type, the monocrystalline silicon having an outer area;

masking only a portion of the outer area of the monocrystalline silicon region;

anisotropically etching into the non-masked portion of monocrystalline silicon in a selective manner of one silicon plane relative to another silicon plane to produce a high elevation area and a low elevation area which are laterally angled relative to one another; the high elevation area and the low elevation area being interconnected by a substantially planar, non-perpendicularly angled surface; and doping into the monocrystalline silicon through the high elevation area, the angled surface and the low elevation area with a conductivity enhancing impurity of a first type to form a continuous electrically conductive and interconnecting diffusion region extending from the high elevation area, through and along the angled surface to the low elevation area.

In accordance with a second aspect, a semiconductor apparatus comprises:

a substrate having a region of monocrystalline silicon, the monocrystalline silicon having a plurality of atoms with each being oriented in a plurality of different plane types;

the region of monocrystalline silicon having a high elevation area and a low elevation area which are laterally angled relative to one another, the high elevation area being parallel with one of the plane types;

the high elevation area and the low elevation area being interconnected by a substantially planar, non-perpendicularly angled surface; the angled surface extending substantially parallel with another of the plane types; and the high elevation area, the angled surface and the low elevation area having a continuously electrically conductive and interconnecting diffusion region of a first conductivity type extending from the high elevation area, through and along the angled surface to the low elevation area.

In accordance with a third aspect of the invention, a semiconductor processing method of forming an electrically conductive projection outwardly extending from a substrate comprises the following steps:

providing a substrate having an outer region of monocrystalline silicon;

epitaxially growing an electrically conductive layer of monocrystalline silicon from the outer region, the epitaxially grown layer being doped during growth with conductivity enhancing impurity of a first conductivity type; and etching the grown monocrystalline silicon layer to produce an outwardly projecting electrically conductive pillar.

In accordance with a fourth aspect of the invention, a semiconductor apparatus comprises:

a monocrystalline silicon region of a first composition; and a monocrystalline silicon electrically conductive pillar projecting from the monocrystalline silicon region, the projecting pillar being of a second monocrystalline silicon composition.

In accordance with yet a fifth aspect of the invention, a method of forming a testing apparatus for engaging electrically conductive test pads on a semiconductor substrate having integrated circuitry for operability testing thereof comprises the following steps:

providing a locally substantially planar outer surface of electrically conductive polysilicon on a monocrystalline silicon substrate;

providing a layer of masking material atop the substantially planar outer surface of electrically conductive polysilicon, the masking material being of different composition from the electrically conductive polysilicon such that the material is capable of substantially masking the electrically conductive polysilicon;

patterning and etching the layer of masking material to selectively outwardly expose the electrically conductive polysilicon and define a grouping of discrete masking blocks, the discrete masking blocks of the grouping having respective centers, the respective centers of the grouping being positioned in sufficient proximity to one another such that the centers of the grouping fall within confines of a given single test pad which the apparatus is adapted to electrically engage;

forming projecting apexes in the electrically conductive polysilicon beneath the masking blocks at the masking block centers, the projecting apexes forming a group falling within the confines of the given single test pad of which the apparatus is adapted to electrically engage;

removing the discrete masking blocks from the electrically conductive polysilicon after the exposing step; and etching the electrically conductive polysilicon selectively relative to the underlying monocrystalline silicon to form an electrically conductive engagement probe.

The discussion first proceeds with description of preferred embodiment methods for forming testing apparatus. Specifically, FIG. 1 illustrates a substrate 10 having a monocrystalline silicon region 12 of a given planar type. Region 12 is in the form of a bulk substrate material, such as a monocrystalline silicon wafer. As known by people of skill in the art, monocrystalline silicon is produced or purchasable to provide a planar outer surface which is parallel with one of three standard planes of the silicon crystal lattice, and are referred to by Miller indices. Those three indices or available planar types for monocrystalline silicon are 100, 110 and 111. The plurality of atoms of the monocrystalline silicon region are accordingly each oriented in a plurality of different plane types.

Silicon wafer 10 would initially be provided with a substantially planar outer area 14. Projecting apexes 15, 16, 17 and 18 would be created in any suitable manner, and would preferably form a group of apexes 19 in the form or at least one polygon shape. For example, a layer of masking material could be provided atop the substantially planar outer area 14. The masking material would be of a different composition from the underlying monocrystalline silicon 12 such that the masking material is capable of substantially masking the underlying monocrystalline silicon for apex formation. An example preferred masking material would be $Si_3N_4$.

The masking material would be patterned and etched to selectively outwardly expose the monocrystalline silicon and define a grouping of discrete masking blocks. The respective centers of the grouping would be positioned in sufficient proximity to one another such that the centers of the group would fall within confines of the given single test pad which the apparatus is adapted to electrically engage. Projecting apexes 15, 16, 17 and 18 are formed beneath the masking blocks at the masking block centers to provide a group of apexes 19. These as well will fall within the confines of the given single test pad of which the apparatus is adapted to electrically engage. The apexes can be produced by exposing the substrate to oxidizing conditions effective to oxidize the exposed outer surface of monocrystalline silicon and to oxidize the monocrystalline silicon beneath the masking blocks, thus forming the apexes. The oxidized material is stripped from the substrate and the discrete masking blocks are removed.

The preferred form or shape of the apexes is multiple knife edge lines which interconnect to form at least one polygon. The apexes can be considered as having tips and bases, with the bases of the adjacent projecting apexes being spaced from one another to define a penetration stop plan therebetween, as shown. In the preferred technique, multiple groupings of such apexes will be produced, with only one such grouping 19 being shown in FIG. 1. Such a method of producing the apexes is more specifically described in our copending U.S. patent application Ser. No. 08/116,394, now U.S. Pat. No. 5,326,428.

Figure 2:
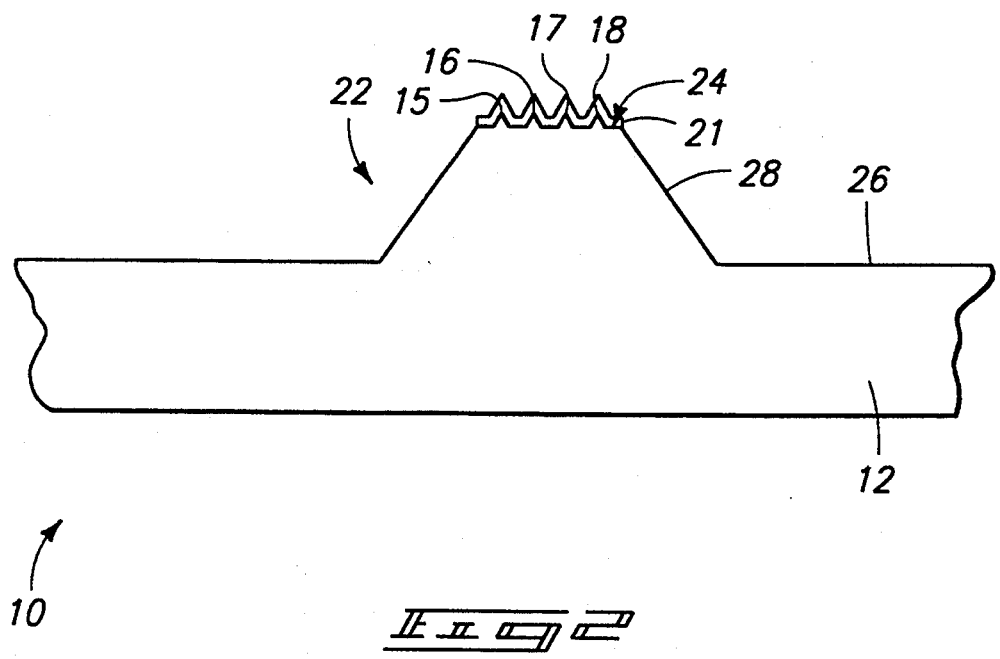
FIG. 2 is a view of the FIG. 1 substrate fragment at a processing subsequent to that shown by FIG. 1.

Referring further to FIG. 1, a metal capping layer 21 is provided atop apex grouping 19. Then apex grouping 19 is masked with a photoresist or other masking material block 20 (i.e., platinum) such that only a portion of outer area 14 of monocrystalline region 12 is masked. Referring to FIG. 2, the non-masked portion of the monocrystalline silicon is then anisotropically etched in a selective manner to produce a pillar 22 having a high elevation area 24 and a low elevation area 26 which are laterally spaced or angled relative to one another. Masking block 20 is thereafter removed.

High elevation area 24 and low elevation 26 are interconnected by a substantially planar, non-perpendicularly angled surface 28. It is believed that substantially any different planar type monocrystalline silicon substrate could be utilized and etched substantially selective relative to another plane to provide the illustrated non-perpendicularly angled surface. Accordingly, an example would be to utilize a 100 monocrystalline silicon wafer, and conduct the anisotropic etch through the 100 plane selectively along the 111 plane to produce an angle which is substantially parallel with the 111 plane. Such will produce surface 28 angled at 54 degrees from horizontal.

An alternate example would be to start with a 110 monocrystalline silicon wafer, and anisotropically etch through the 110 plane selectively along the 111 plane to produce an angle which is substantially parallel with the 111 plane. Such will produce angled surface 28 angled at 35.26° from horizontal or the 110 plane.

An example etch to produce the illustrated construction would be a wet etch at 60° C. using a 45% by volume KOH solution in water. Such a solution will selectively etch a 100 monocrystalline silicon wafer relative to the 111 plane at a ratio of approximately 100:1. This same solution will etch a 110 monocrystalline silicon wafer selectively relative to the 111 plane at a ratio of 400:1.

Referring to FIG. 3, substrate 10 is masked with photoresist 30. Thereafter, doping is conducted into the monocrystalline silicon through metal cap 21, apexes 15, 16, 17 and 18, high elevation area 24, angled surface 28 and low elevation area 26 with a first type conductivity enhancing impurity (i.e., either n or p type) to form a continuous electrically conductive and interconnecting diffusion region 32. Diffusion or ion implantation doping are example methods. Diffusion region 32 extends from high elevation area 24, through and along angled surface 28 to low elevation area 26. Accordingly, electrical interconnection is provided to the upper apexes of pillar 22 to a lower elevation area which would connect or otherwise join with powering or test circuitry. Photoresist 30 is thereafter removed, as shown in FIG. 4. Then preferably, substrate 10 is subjected to field oxide producing conditions to produce silicon dioxide region 23 over the non-metal cap exposed portion of the substrate. In accordance with the Ser. No. 08/116,394 disclosure, the above described process provides another example of rendering the projecting apexes electrically conductive.

In one aspect of the invention, monocrystalline silicon region 12 is provided in an initially undoped condition prior to the illustrated FIG. 3 doping step. More preferably, monocrystalline silicon region 12 is doped prior to the FIG. 3 doping step with an impurity of a second conductivity type to provide desired subsequent electrical isolation between diffusion region 32 and the remainder of the substrate by a pn or np junction. The diffusion to produce region 32 would be of a sufficient dose to effectively overcome the concentration of the previously doped opposing conductivity type impurity.

In the preferred previously described embodiment, apexes 15, 16, 17 and 18 were formed prior to the formation of pillar 22. Alternately, such apexes could of course be produced after the pillar were formed.

Although the above techniques were developed in conjunction with providing desired pillar shapes and electrical interconnections relative thereto, the artisan will appreciate that the teachings will have applicability in semiconductor processing to other than pillar formation.

An alternate semiconductor processing method of forming an electrically conductive projection outwardly from a substrate, and alternate semiconductor apparatus, is described with reference to FIGS. 5-6. FIG. 5 illustrates a substrate 35 initially having an outer region 36 of monocrystalline silicon of a first composition. Thereafter, an electrically conductive layer 38 of monocrystalline silicon would be epitaxially grown from outer region 36. Such epitaxially grown layer 38 is doped during its growth process with conductivity enhancing impurity of a first conductivity type. Projecting apexes could then be formed as described above in the outer surface of epitaxially grown layer 38.

Referring to FIG. 6, epitaxially grown layer 38 would then be etched to produce an outwardly projecting electrically conductive pillar 40. Pillar 40 is, for example, shown as having a lower electrically conductive extending region 42 for electrical connection with other circuitry. Such extending region can be made integrally with the mask used to form pillar 40, or with another masking step. Projecting pillar 40 is of a second monocrystalline silicon composition different from the first composition of region 36. Sidewalls of pillar 40 are shown as being produced by the above described anisotropic selective planar etching. Of course, alternately, anisotropic etching to produce substantially perpendicular side walls could be conducted. The illustrated apexes 15, 16, 17 and 18 could be produced before or after the patterning of layer 38 to produce a pillar 40.

Monocrystalline silicon of region 36 could be provided of an undoped composition, whereas pillar 40 would be doped with either p or n type impurity at a sufficient concentration to provide desired essential complete conductivity of pillar 40. Alternately and more preferred, monocrystalline silicon region 36 is doped with an impurity of an alternate conductivity type than which layer 38 is doped to provide pn or np electrical isolation between region 36 and pillar 40.

Where layer 38 and layer 36 are each doped but with different type impurities, anisotropic selective etching based entirely on the composition can be conducted of layer 38 relative to layer 36. For example, where layer 38 comprises p-type doping and layer 36 comprises n-type doping, an example wet etch solution and conditions which would produce high selectivity would be an aqueous KOH solution with region 36 being biased. Where layer 38 comprises n-type doping and layer 36 comprises p-type doping, an example wet etching solution would be an aqueous KOH solution and no biasing. See for example Sarro et al., "Silicon Cantilever Beams Fabricated By Electrochmeically Controlled Etching For Sensor Applications", *J. Electrochem. Soc.: Solid-State Science and Technology,* vol. 133, No. 8, pp. 1724–1729 (Aug. 1986).

An alternate technique for forming a testing apparatus for engaging electrically conductive test pads on a semiconductor substrate to provide an essentially entirely electrically conductive projection could also of course be provided. For example referring to FIG. 5, layer 38 could be provided to be electrically conductive polysilicon. Such could be patterned to produce the construction of FIG. 6, whereby the produced pillar and apexes constitute electrically conductive polysilicon and the underlying region 36 is monocrystalline silicon. Conductivity type doping within each would also of course preferably be opposing p and n type to provide desired pn or np electrical isolation.

Of course with either of the embodiments described above with respect to FIGS. 5 and 6, a separate metal cap could be provided atop the high elevation areas and apexes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a high elevation area and a low elevation area in a substrate and of electrically interconnecting the high elevation area and the low elevation area, the method comprising the following steps:

providing a substrate having a region of monocrystalline silicon of a given planar type, the monocrystalline silicon having an outer area;

masking only a portion of the outer area of the monocrystalline silicon region;

anisotropically etching into the non-masked portion of monocrystalline silicon in a selective manner of one silicon plane relative to another silicon plane to produce a high elevation area and a low elevation area which are laterally angled relative to one another; the high elevation area and the low elevation area being interconnected by a substantially planar, non-perpendicularly angled surface; and doping into the monocrystalline silicon through the high elevation area, the angled surface and the low elevation area with a conductivity enhancing impurity of a first type to form a continuous electrically conductive and interconnecting diffusion region extending from the high elevation area, through and along the angled surface to the low elevation area.

2. The method of forming and electrically interconnecting of claim 1 wherein the outer area of monocrystalline silicon is provided with a covering layer of metal, the covering metal layer also being masked in the masking step, the masked covering layer being etched prior to the anisotropically etching step to provide a metal cap atop the portion of the outer area of monocrystalline silicon region, the step of doping being conducted through the covering metal layer.

3. The method of forming and electrically interconnecting of claim 1 wherein the region of monocrystalline silicon is initially undoped prior to the doping step.

4. The method of forming and electrically interconnecting of claim 1 wherein the region of monocrystalline silicon is doped prior to the doping step with an impurity of a second type.

5. The method of forming and electrically interconnecting of claim 1 wherein the planar type of the monocrystalline silicon region is 100, and the anisotropic etch is conducted through the 100 plane selectively along the 111 plane.

6. The method of forming and electrically interconnecting of claim 1 wherein the planar type of the monocrystalline silicon region is 110, and the anisotropic etch is conducted through the 110 plane selectively along the 111 plane.

7. The method of forming and electrically interconnecting of claim 1 wherein the step of providing a substrate having a monocrystalline silicon region and the step of masking only a portion of the outer area of the monocrystalline silicon region collectively comprise:

providing the monocrystalline silicon region with the outer area being substantially planar;

providing a layer of masking material atop the substantially planar outer area, the masking material being of different composition from the underlying monocrystalline silicon such that the material is capable of substantially masking the underlying monocrystalline silicon;

patterning and etching the layer of masking material to selectively outwardly expose the monocrystalline silicon and define a grouping of discrete masking blocks, the discrete masking blocks of the grouping having respective centers, the respective centers of the grouping being positioned in sufficient proximity to one another such that the centers of the grouping fall within confines of a given single test pad which the apparatus is adapted to electrically engage;

forming projecting apexes in the monocrystalline silicon beneath the masking blocks at the masking block centers, the projecting apexes forming a group falling within the confines of the given single test pad of which the apparatus is adapted to electrically engage; and removing the discrete masking blocks from the monocrystalline silicon after the exposing step.

8. The method of forming and electrically interconnecting of claim 7 wherein the step of providing a substrate having a monocrystalline silicon region and the step of masking only a portion of the outer area of the monocrystalline silicon region collectively comprise:

conducting said masking step after the apex forming step, and wherein said masking step includes masking the projecting apexes; and wherein the anisotropic etching and doping steps are conducted after the masking of the projecting apexes.

9. A semiconductor apparatus comprising:

a substrate having a region of monocrystalline silicon, the monocrystalline silicon having a plurality of atoms with each being oriented in a plurality of different plane types;

the region of monocrystalline silicon having a high elevation area and a low elevation area which are laterally angled relative to one another, the high elevation area being parallel with one of the plane types;

the high elevation area and the low elevation area being interconnected by a substantially planar, non-perpendicularly angled surface; the angled surface extending substantially parallel with another of the plane types; and the high elevation area, the angled surface and the low elevation area having a continuously electrically conductive and interconnecting diffusion region of a first conductivity type extending from the high elevation area, through and along the angled surface to the low elevation area.

10. The semiconductor apparatus of claim 9 wherein the high elevation region is covered by a metal cap.

11. The semiconductor apparatus of claim 9 wherein the region of monocrystalline silicon outside of the diffusion region is undoped.

12. The semiconductor apparatus of claim 9 wherein the region of monocrystalline silicon outside of the diffusion region is doped with an impurity of a second conductivity type.

13. The semiconductor apparatus of claim 9 wherein the high elevation area is parallel with the 100 plane, and the angled surface is substantially parallel along the 111 plane.

14. The semiconductor apparatus of claim 9 wherein the high elevation area is parallel with the 110 plane, and the angled surface is substantially parallel along the 111 plane.

15. The semiconductor apparatus of claim 9 wherein the high elevation area, the low elevation area and angled surface form an engagement probe projecting from the low elevation area to engage a single test pad on a semiconductor substrate having integrated circuitry formed in the semiconductor substrate, the high elevation area of the engagement probe comprising a grouping of a plurality of electrically conductive projecting apexes positioned in sufficient proximity to one another to collectively engage the single test pad.

16. The semiconductor apparatus of claim 9 wherein the high elevation area, the low elevation area and angled surface form an engagement probe projecting from the low elevation area to engage a single test pad on a semiconductor substrate having integrated circuitry formed in the semiconductor substrate, the high elevation area of the engagement probe comprising a metal cap, the high elevation area of the engagement probe comprising a grouping of a plurality of electrically conductive projecting apexes positioned in sufficient proximity to one another to collectively engage the single test pad.

17. A semiconductor processing method of forming an electrically conductive projection outwardly extending from a substrate, the method comprising the following steps:

providing a substrate having an outer region of monocrystalline silicon;

epitaxially growing an electrically conductive layer of monocrystalline silicon from the outer region, the epitaxially grown layer being doped during growth with conductivity enhancing impurity of a first conductivity type; and etching the grown monocrystalline silicon layer to produce an outwardly projecting electrically conductive pillar.

18. The semiconductor processing method of claim 17 wherein the outer region of monocrystalline silicon is undoped.

19. The semiconductor processing method of claim 17 wherein the outer region of monocrystalline silicon is doped with a conductivity enhancing impurity of a second type prior to the step of epitaxially growing.

20. The semiconductor processing method of claim 17 wherein the outer region of monocrystalline silicon is doped with a conductivity enhancing impurity of a second type prior to the step of epitaxially growing, the etching step comprising selectively etching first type doped grown silicon selectively relative to the second type doped region.

21. The semiconductor processing method of claim 17 wherein the step of etching the grown monocrystalline silicon layer to produce an outwardly projecting electrically conductive pillar comprises:

providing the monocrystalline silicon layer with a substantially planar outer surface;

providing a layer of masking material atop the substantially planar outer surface, the masking material being of different composition from the underlying monocrystalline silicon such that the material is capable of substantially masking the underlying monocrystalline silicon;

patterning and etching the layer of masking material to selectively outwardly expose the monocrystalline silicon and define a grouping of discrete masking blocks, the discrete masking blocks of the grouping having respective centers, the respective centers of the grouping being positioned in sufficient proximity to one another such that the centers of the grouping fall within confines of a given single test pad which the apparatus is adapted to electrically engage;

forming projecting apexes in the monocrystalline silicon beneath the masking blocks at the masking block centers, the projecting apexes forming a group falling within the confines of the given single test pad of which the apparatus is adapted to electrically engage; and removing the discrete masking blocks from the monocrystalline silicon after the exposing step.

22. The semiconductor processing method of claim 21 wherein the step of etching the grown monocrystalline silicon layer to produce an outwardly projecting electrically conductive pillar comprises:

after the forming step, masking the projecting apexes and etching into the grown monocrystalline silicon layer around the masked projecting apexes to form a pillar outwardly of which the projecting apexes project.

23. A semiconductor apparatus comprising:

a monocrystalline silicon region of a first composition; and a monocrystalline silicon electrically conductive pillar projecting from the monocrystalline silicon region, the projecting pillar being of a second monocrystalline silicon composition.

24. The semiconductor apparatus of claim 23 wherein the projecting pillar is covered by a metal cap.

25. The semiconductor apparatus of claim 23 wherein the first composition is undoped monocrystalline silicon.

26. The semiconductor apparatus of claim 23 wherein the first composition is monocrystalline silicon doped with an impurity of a first conductivity type, and wherein the second composition is monocrystalline silicon doped with an impurity of a second conductivity type.

27. The semiconductor apparatus of claim 23 wherein the electrically conductive pillar comprises a high elevation area and the monocrystalline silicon region of first composition comprises a low elevation area, said pillar forming an engagement probe projecting from the low elevation area to engage a single test pad on a semiconductor substrate having integrated circuitry formed in the semiconductor substrate, the high elevation area of the engagement probe comprising a grouping of a plurality of electrically conductive projecting apexes positioned in sufficient proximity to one another to collectively engage the single test pad.

28. A method of forming a testing apparatus for engaging electrically conductive test pads on a semiconductor substrate having integrated circuitry for operability testing thereof, the method comprising the following steps:
providing a locally substantially planar outer surface of electrically conductive polysilicon on a monocrystalline silicon substrate;
providing a layer of masking material atop the substantially planar outer surface of electrically conductive polysilicon, the masking material being of different composition from the electrically conductive polysilicon such that the material is capable of substantially masking the electrically conductive polysilicon;
patterning and etching the layer of masking material to selectively outwardly expose the electrically conductive polysilicon and define a grouping of discrete masking blocks, the discrete masking blocks of the grouping having respective centers, the respective centers of the grouping being positioned in sufficient proximity to one another such that the centers of the grouping fall within confines of a given single test pad which the apparatus is adapted to electrically engage;
forming projecting apexes in the electrically conductive polysilicon beneath the masking blocks at the masking block centers, the projecting apexes forming a group falling within the confines of the given single test pad of which the apparatus is adapted to electrically engage;
removing the discrete masking blocks from the electrically conductive polysilicon after the exposing step; and
etching the electrically conductive polysilicon selectively relative to the underlying monocrystalline silicon to form an electrically conductive engagement probe.

29. The method of forming a testing apparatus for engaging electrically conductive test pads of claim 28 wherein the monocrystalline silicon is undoped.

30. The method of forming a testing apparatus for engaging electrically conductive test pads of claim 28 wherein the monocrystalline silicon is doped with a conductivity enhancing impurity of a first conductivity type, and wherein the electrically conductive polysilicon is doped with a conductivity enhancing impurity of a second conductivity type.

31. The method of forming a testing apparatus of claim 28 wherein the masking material is capable of substantially masking the underlying polysilicon from oxidation when the substrate is exposed to oxidizing conditions, the step of forming the projecting apexes comprises:
exposing the substrate to oxidizing conditions effective to oxidize the exposed outer surface of polysilicon and oxidize polysilicon beneath the masking blocks to form the projecting apexes at the masking block centers, and further comprising stripping oxidized first material from the substrate.

32. The method of forming a testing apparatus of claim 28 wherein the steps of patterning and etching and forming comprise forming multiple groupings of discrete masking blocks and multiple groups of projecting apexes, each group being sized and configured for engaging a respective single test pad.

33. The method of forming a testing apparatus of claim 28 wherein the steps of patterning and etching and forming produce projecting apexes in the form of multiple knife-edge lines.

34. The method of forming a testing apparatus of claim 28 wherein the steps of patterning and etching and forming produce projecting apexes in the form of multiple knife-edge lines, the multiple knife-edge lines interconnecting to form at least one polygon.

35. The method of forming a testing apparatus of claim 28 wherein the steps of patterning and etching and forming produce apexes which project from a common plane, the apexes having respective tips and bases, the bases of adjacent projecting apexes being spaced from one another to define a penetration stop plane therebetween.

* * * * *